United States Patent [19]

Yamaguchi

[11] 4,052,669
[45] Oct. 4, 1977

[54] LINEAR SCALE ELECTRIC METER WITH CYLINDRICAL INTERNAL MAGNET AND TWO ARC-SHAPED AUXILIARY YOKES

[75] Inventor: Susumu Yamaguchi, Kokubunji, Japan

[73] Assignee: Kizo Adachi, Tokyo, Japan

[21] Appl. No.: 611,417

[22] Filed: Sept. 8, 1975

[51] Int. Cl.$^2$ ............................................. G01R 5/06
[52] U.S. Cl. .................................................. 324/151 A
[58] Field of Search ............... 324/151 R, 151 A, 146, 324/154 R

[56] References Cited

U.S. PATENT DOCUMENTS

| | | | |
|---|---|---|---|
| 2,110,680 | 3/1938 | Rowell | 324/151 A |
| 2,816,255 | 12/1957 | Greif | 324/151 A |
| 2,836,796 | 5/1958 | Millar et al. | 324/151 A |
| 2,840,767 | 6/1958 | Ammon | 324/151 A X |
| 2,846,649 | 8/1958 | Hornauer | 324/151 A X |
| 2,901,702 | 8/1959 | Endlich | 324/151 A |
| 3,273,061 | 9/1966 | Rumpelein et al. | 324/151 R |
| 3,602,815 | 8/1971 | Rumpelein et al. | 324/151 A |

FOREIGN PATENT DOCUMENTS

| | | | |
|---|---|---|---|
| 696,274 | 9/1940 | Germany | 324/151 R |
| 17,753 | 12/1915 | United Kingdom | 324/151 R |
| 422,878 | 4/1934 | United Kingdom | 324/151 A |

*Primary Examiner*—Gerard R. Strecker
*Attorney, Agent, or Firm*—Flynn & Frishauf

[57] ABSTRACT

An electric meter comprises a cylindrical internal magnet so magnetized as to have N and S poles oriented in a direction such that a straight line connecting both poles intersects with the central axis of the magnet at right angles thereto. First and second circular arc-shaped auxiliary yokes are provided along the magnetized direction of said cylindrical internal magnet, around the outer periphery of the internal magnet, and at prescribed distances from the N and S poles of the magnet, and a movable coil is pivotally mounted in the magnetic field produced between the tip end portions of the first and second auxiliary yokes and the N and S poles of the cylindrical internal magnet.

11 Claims, 11 Drawing Figures

LINEAR SCALE ELECTRIC METER WITH CYLINDRICAL INTERNAL MAGNET AND TWO ARC-SHAPED AUXILIARY YOKES

BACKGROUND OF THE INVENTION

This invention relates to an electric meter, and more particularly to a movable coil type meter using an internal magnet.

The movable coil type meter, particularly the internal magnet type meter, since its construction is very simple, is widely used in, for example, a stereophonic appliance as a compact meter for use as an indicator. in this internal magnet type meter, a movable coil is turnably or pivotally supported at a position which is near the N and S poles of an internal magnet provided in the meter and where the magnetic flux density is high. When a current to be measured flows in said movable coil, this movable coil is turned through a prescribed angle due to the magnetic action between a magnetic flux produced by this measurement current and a magnetic flux produced from the internal magnet. The turned angle in this case is proportional to the ampere turns of the movable coil and the magnetic flux density of the internal magnet. The magnetic flux density of the internal magnet is the highest at the N and S poles thereof and, as the distances from both poles become large, is decreased. Now, when the turned angle of the movable coil from both poles of the internal magnet is $\theta$, the density of that magnetic flux of the internal magnet which the movable coil cuts can be generally said to be proportional to cos $\theta$. Accordingly, in such internal magnet type meter, its scale can not be made linear.

In order that the above-mentioned internal magnet type meter can have a linear scale, for example, a magnet wherein magnetic pole pieces made of soft-iron are attached respectively to the N and S poles of the internal magnet so as to obtain a uniform field is employed. In this method, however, the N and S poles must be worked, which, however, is followed by difficulties and requires a considerably high working precision. Accordingly, this meter is not satisfactory for use as a compact meter from the standpoint of mechanical work and cost. Further, even the use of such method causes the magnetic flux density to be gradually decreased with each of the N and S poles as a center, failing to obtain a completely uniform magnetic field.

SUMMARY OF THE INVENTION

The object of the invention is to provide an internal magnet type electric meter which is simple in construction and yet capable of obtaining a linear scale and which has a good mass-productivity.

According to the invention, an electric meter comprises a cylindrical internal magnet so magnetized as to have N and S poles oriented in a direction such that a straight line connecting both said poles intersects the central axis of said internal magnet at right angles thereto. First and second circular arc-shaped auxiliary yokes are provided opposite to each other so as to intersect the N and S pole arrangement of said cylindrical internal magnet at a prescribed distance from the outer periphery thereof, and means is provided for turnably or pivotally supporting the movable coil in a magnetic field produced between the tip end portions of said first and second auxiliary yokes and the N and S poles of said cylindrical internal magnet.

DESCRIPTION OF THE PREFERRED EMBODIMENTS

Figure 1:
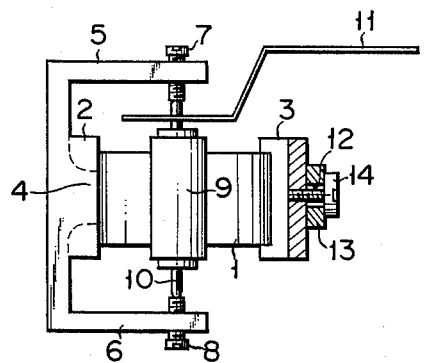
FIG. 1 is a side view showing an internal magnet type meter according to an embodiment of the invention.
Figure 2:
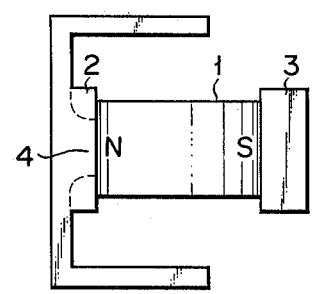
FIGS. 2 and 3 are side and plan views showing only the internal magnet and auxiliary yokes according to the embodiment of FIG. 1.
Figure 3:
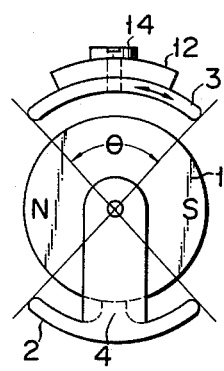

In FIGS. 1 to 3, a cylindrical internal magnet 1 of an internal magnet type meter is so magnetized as to have N and S poles in a direction wherein a straight line between both poles intersects the central axis of the internal magnet 1 at a right angle thereto. In a direction intersecting the N and S pole arrangement of the internal magnet 1 circular arc-shaped auxiliary yokes 2, 3 are provided concentrically with the internal magnet 1 at a prescribed distance from the outer periphery thereof. These auxiliary yokes 2, 3 are formed of, for example, soft-iron sheet material. One auxiliary yoke 2 has a projecting portion 4, to which the magnet 1 is soldered. From the central parts of the upper and lower sides of the auxiliary yoke 2 are projected an upper frame 5 and a lower frame 6, respectively, respective tip end portions of which are so bent at an angle of substantially 90° as to oppose each other. Into the upper frame 5 and lower frame 6 are screwed pivot screws 7 and 8, between which is turnably supported a supporting shaft 10 fitted with a movable coil 9. A compass or indicating needle 11 is fixed to the supporting shaft 10. The auxiliary yoke 3 is fixed by a screw 14 to a supporting member 13 having a laterally elongated slit 12. Accordingly, the lateral position of the auxiliary yoke 3 is easily adjustable in a direction indicated by an arrow of FIG. 3 by loosening the screw 14 and moving it along the slit 12.

Since the internal magnet type meter is constructed as above described, the magnetic fluxes from the N and S poles of the internal magnet 1 are attracted into the auxiliary yokes 2, 3 and are averagely distributed covering from the N and S poles to the end portions of the auxiliary yokes 2, 3 without being concentrated, at the proximity of the N and S poles, into a narrow width. In this case, when, as shown in FIG. 3, the length of the auxiliary yokes 2, 3 is so determined that an open angle $\theta$ defined by those two straight lines extending from the center of the internal magnet 1 which are tangent to each of the auxiliary yokes 2, 3 becomes 90°, a linear scale whose permissible error is less than that of the 2.5 grade of the Japanese Industrial Standards is obtained. Said open angle, that is to say, the length of the auxiliary yokes 2, 3 is more or less variable depending upon the thickness of the auxiliary yokes 2, 3, and may be smaller when this thickness is large.

Since, in this embodiment, the auxiliary yoke 2 is constructed integrally with the frames 5, 6 and the internal magnet 1, the assembling operation is less troublesome and yet is easy. Further, since the internal magnet 1 and the position of the auxiliary yoke 2 relative to the internal magnet 1 are fixed, an internal magnet type meter having a predetermined property can be obtained even when mass-produced. Further, since even an internal magnet type meter having only the auxiliary yoke 2 gives a considerably linear scale, it is considered as possible to manufacture an internal magnet type meter without using the auxiliary yoke 3.

Further, where it is desired to obtain a close linear scale, the screw 14 is loosened and the lateral position of the auxiliary yoke 3 has simply to be minutely moved in the arrow-indicated direction of FIG. 3.

Figure 4:
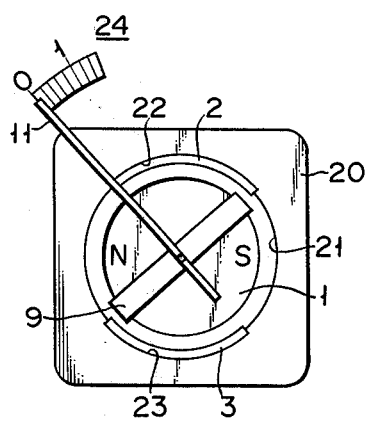
FIG. 4 is a plan view showing a main part of another embodiment of the invention.
Figure 5:
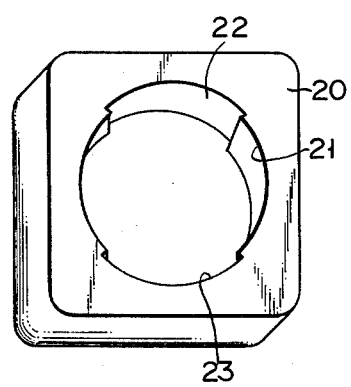
FIG. 5 is a perspective view showing the frame of FIG. 4.
Figure 6:
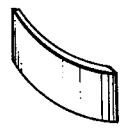
FIG. 6 is a perspective view showing an example of an auxiliary yoke being inserted into and supported by the frame shown in FIGS. 4 and 5.

FIGS. 4 and 6 show another embodiment of the invention wherein said auxiliary yokes 2, 3 are supported by another supporting method. A case 20 whose contour is substantially square has formed therein a circular hole 21 whose diameter is slightly greater than the diameter of the cylindrical internal magnet 1. The side wall of this circular hole 21 is formed with circular arc-shaped recesses 22, 23 having a length making it possible that an open angle defined by those two straight lines extending from the center of the internal magnet 1 which are tangent to each of said recesses becomes about 90°, and the auxiliary yokes 2, 3 are supported by being fitted into said recesses 22, 23. Outside the internal magnet 1 the movable coil 9 and compass needle 11 are supported similarly to FIG. 1. A reference numeral 24 denotes part of a linear scale obtained according to the invention.

Figure 7:
FIG. 7 is a side view showing another auxiliary yoke.
Figure 8:
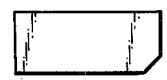
FIG. 8 is a side view showing a still another auxiliary yoke.

The auxiliary yoke employed in the preceding embodiment, as shown in FIG. 6, was comprised of a bent soft-iron sheet having as a whole the same width, but the configuration of this auxiliary yoke can of course be variously modified in order to obtain a predetermined scale property, that is, a magnetic flux density distribution within the range wherein the movable coil is rocked. In an auxiliary yoke of FIG. 7, its one end portion is formed into a rectangular shape and its other end portion is formed into a streamlined shape. In an auxiliary yoke of FIG. 8, its one end portion is formed rectangular and its other end portion is formed also into a rectangular shape whose one angular portion is cut off. The magnetically coupled degree of the modified end of the auxiliary yokes of FIGS. 7 and 8 to a magnetic pole is more or less low as compared with that of the other rectangular end of these yokes to a magnetic pole. These auxiliary yokes as modified can be used particularly when the scale does not become linear at its end portions.

The operation of the above-mentioned electric meter of the invention is hereinafter described further in detail by reference to FIGS. 9 to 11. In this electric meter, a circular arc soft-iron piece is concentrically disposed around the cylindrical internal magnet.

Figure 9:
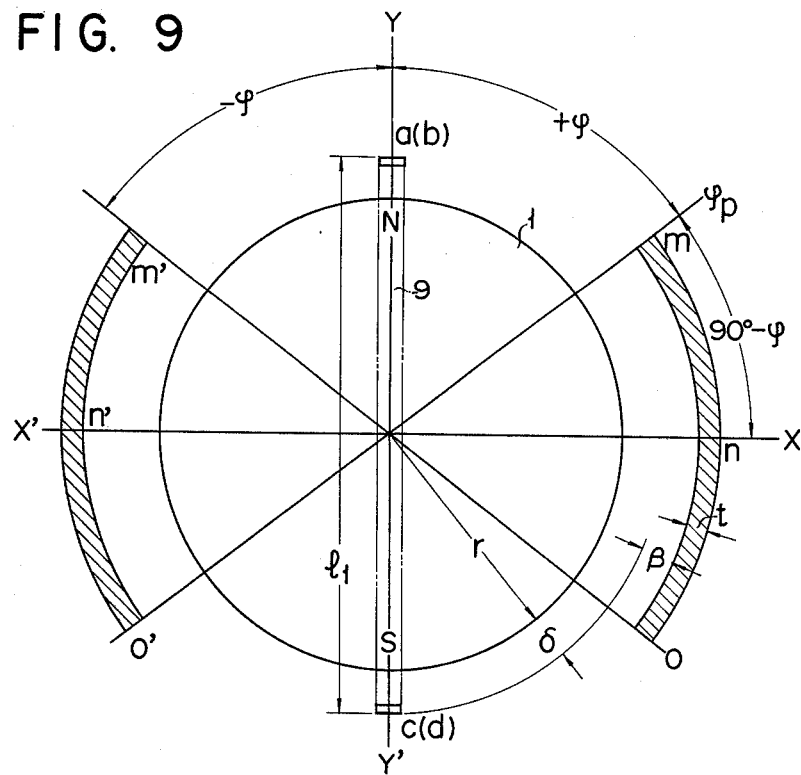
FIG. 9 is a diagrammatical arrangement view for explaining the operation of a meter according to the invention.
Figure 10:
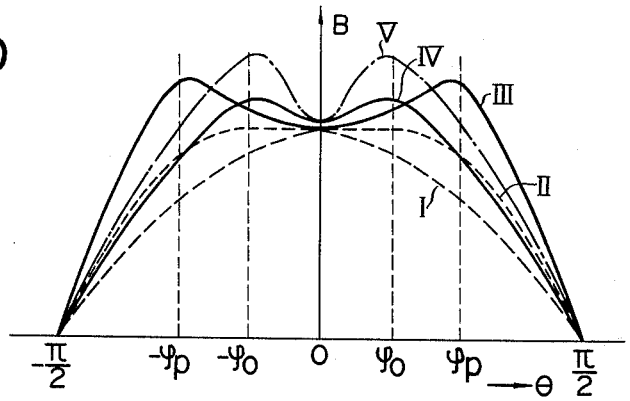
FIG. 10 graphically shows the relation between the magnetic flux density around the internal magnet and the angle of operating range of a movable coil.

As shown in FIG. 9, determination is made such that $(l_1/2 - \gamma) = \delta[m]$, and two soft-iron pieces $mno$ and $m'n'o'$ having a thickness of $t$ are disposed on the circumference of a circle whose radius is $(\gamma + \delta + \beta)$ [m], on the axis X-X', at positions shifted through an angle of $\pm \phi$ from the axis Y-Y' and symmetrically with respect to the axis Y-Y', to construct an internal magnet type-movable coil meter, and determination is made of the driving torque of the movable coil 9 where a current of I[A] is allowed to flow in that meter. Now, an $a\ b\ c\ d$-rectangular coil 9 having a winding number of N, an average width of $l_1[m]$ and an average height of $l_2[m]$ ($l_1 > \gamma$, $l_2 > h$) is disposed concentrically with a cylindrical magnet 1 whose radius and height are $\gamma[m]$ and $h[m]$, respectively and which has N and S poles at positions raised by h from both ends of the diametric axis of the cylindrical magnet 1. In this case, the distribution condition of a line of magnetic force as resulting from the disposition of a soft-iron piece having high magnetic permeability, that is, generally the magnetic flux density at those circumference portions of a circle having a radius of $(\gamma + \delta)$ which correspond to the operating range of the movable coil 9 (the range of $\theta = \pm(\pi/4)$ with this $\theta = 0$ taken as the center) is considered as a function of $\theta$, $\beta$, $\phi$ and $t$, that is, as $B_2 = f(\theta, \beta, \phi, t)$ and, when each of the values of $\beta$, $\phi$ and $t$ is set at a specified value, becomes a function of $\theta$ only, that is, as $B_2 = f(\theta)$. FIG. 10 shows several examples of the magnetic flux density. The magnetic flux density distribution as viewed relative to the angle $\theta$ where the soft-iron piece is fixed under the condition of $\phi = \phi_P$ is as follows. That is, when $\beta \to \infty$, a curve (I) results (cosine distribution), and as the value of $\beta$ becomes small, curves (II) and (III) result, and when $\theta = \pm \phi_P$, peaks result.

Next, the magnetic flux distribution under the condition of $\phi = \phi_Q (0 < \phi_Q < \phi_P)$ assumes a pattern wherein, as shown by curves (IV) and (V), peak positions are shifted inwardly (toward the center $\theta = 0$). In this case, accordingly, when $\theta \approx 0$, an angle $\alpha$ defined by the coil with a straight line tangential to the line of magnetic force from the magnet at the coil position is also substantially 0, that is $\alpha \approx 0$, and when the angle $\theta$ is slightly increased, the angle $\alpha$ is rapidly increased, and thereafter the angle $\alpha$ is gradually decreased, and in the neighbourhood of $\theta \approx (\pi/2)$, the angle $\pi$ becomes substantially 0. Therefore, the driving torque $\tau'_D$ is as follows.

$$\tau'_D \approx I l_1 l_2 N f(\theta, \beta, \phi, t) \cos \alpha = I l_1 l_2 N B_2 \cos \alpha \text{TM} \quad (1)$$

where $B_2 = f(\theta, \beta, \phi, t)$.

Accordingly, if the angle of deviation is determined as ranging between $\theta = \pm(\pi/4)$ with $\theta = 0$ taken as the center and a winding spring is used as giving a control torque and the values of $\beta$, $\phi$ and $t$ are determined so as to satisfy the condition of $f(\theta, \beta, \phi, t) \cos \alpha = $ const, $B_2 \cos \alpha = f(\theta) \cos \alpha = k$, and the equation (1) is rewritten as follows.

$$\tau'_D \approx k l_1 l_2 NI = k'I \quad (2)$$

where $k' = k l_1 l_2 N$.

Figure 11:
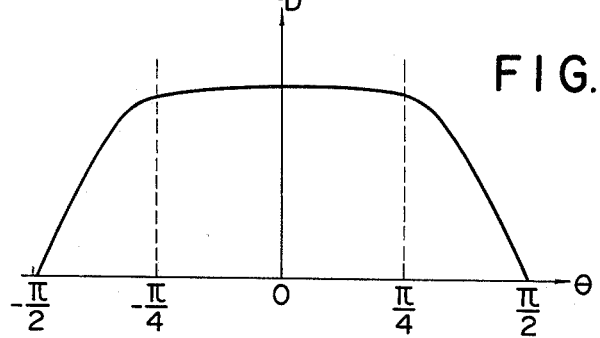
FIG. 11 graphically shows the relation between the driving torque and the turned angle of the movable coil.

Thus, an internal magnet type-movable type-movable coil meter having a linear scale as in FIG. 11 within the operating range without having anything to do with the angle $\theta$ can be constructed. FIG. 11 shows a curve representing $f(\theta, \beta, \phi, t) \cos \alpha$. As apparent from FIG. 11, the $f(\theta, \beta, \phi, t) \cos \alpha$ is constant when $-\pi/4 < f(\theta, \beta, \phi, t) \cos \alpha < \pi/4$. Accordingly, if the movable coil is turned within this range, a linear scale is obtained.

What is claimed is:

1. An electric meter providing a substantially linear scale, comprising:
   a cylindrical internal magnet having a central axis and being diametrically magnetized so as to have N and S poles which are oriented such that a straight line connecting both said N and S poles intersects with said central axis of said internal magnet at right angles thereto.
   first and second separated circular arc-shaped non-magnetized auxiliary yokes made of soft-iron and located opposite to each other about the outer periphery of said cylindrical internal magnet and oriented such that a straight line therebetween intersects the straight line connecting the N and S-pole arrangement of said cylindrical internal magnet, said non-magnetized auxiliary yokes being spaced a prescribed distance from the outer periphery of said cylindrical internal magnet,
   said non-magnetized auxiliary yokes each having first and second tip end portions, the first tip end portions of said yokes being spaced from each other and being located on one side of a further straight line passing through the central portions of said yokes and said central axis of said cylindrical internal magnet, and the second tip end portions of said yokes being spaced from each other and being located on the other side of said further straight line,
   a movable coil, and
   means for turnably supporting said movable coil so as to permit said movable coil to swing substantially in a yoke-free position in the spaces between said tip end portions of said non-magnetized auxiliary yokes about said central axis in a magnetic field produced in the space between said first tip end portions of said first and second non-magnetized auxiliary yokes and one pole of said cylindrical internal magnet and in the space between said second tip end portions of said first and second non-magnetized auxiliary yokes and the other pole of said cylindrical internal magnet.

2. An electric meter according to claim 1, wherein said first auxiliary yoke includes a pair of frames integrally formed with said first auxiliary yoke; and said movable coil is pivotally supported between said pair of frames.

3. An electric meter according to claim 2, wherein said second auxiliary yoke includes position adjusting means for adjusting the position of said second auxiliary yoke relative to said cylindrical internal magnet.

4. An electric meter according to claim 1, comprising a case having a circular hole whose diameter is slightly greater that that of said internal magnet, said case receiving said internal magnet therein, said case having circular arc-shaped recesses formed in a side wall of said circular hole of said case, said first and second auxiliary yokes being held in respective ones of said circular arc-shaped recesses.

5. An electric meter according to claim 4, wherein said case is turnable about said central axis of said internal magnet.

6. An electric meter according to claim 4 wherein said case is made of non-magnetic material.

7. An electric meter according to claim 1, wherein at least one of said first and second auxiliary yokes is a rectangular soft-iron sheet bent into a circular arc-like configuration.

8. An electric meter according to claim 7, wherein the other of said auxiliary yokes is a soft-iron sheet, one end of which is rectangular and the other end of which is formed into a tapered configuration.

9. An electric meter according to claim 7, wherein said other auxiliary yoke is a rectangular soft-iron sheet, one angular portion of which is cut off triangularly.

10. An electric meter according to claim 1 wherein said straight line between said auxiliary yokes and intersecting the straight line connecting the N and S poles of said cylindrical internal magnet is located between the centers of said auxiliary yokes.

11. An electric meter according to claim 10 wherein said straight line between said auxiliary yokes and intersecting the straight line connecting the N and S poles of said cylindrical internal magnet intersects said straight line connecting said N and S poles at a right angle.

* * * * *